(12) United States Patent
Adachi

(10) Patent No.: US 10,262,737 B2
(45) Date of Patent: Apr. 16, 2019

(54) SEMICONDUCTOR INTEGRATED CIRCUIT

(71) Applicant: Kabushiki Kaisha Toshiba, Minato-ku, Tokyo (JP)

(72) Inventor: Yoshinori Adachi, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/701,533

(22) Filed: Sep. 12, 2017

(65) Prior Publication Data

US 2018/0277213 A1 Sep. 27, 2018

(30) Foreign Application Priority Data

Mar. 22, 2017 (JP) ................. 2017-056033

(51) Int. Cl.
*G11C 15/00* (2006.01)
*G11C 14/00* (2006.01)
*G11C 7/10* (2006.01)
*H03K 19/00* (2006.01)
*G11C 7/20* (2006.01)
*G11C 11/00* (2006.01)
*G11C 11/417* (2006.01)

(52) U.S. Cl.
CPC ........ *G11C 14/0054* (2013.01); *G11C 7/1069* (2013.01); *G11C 7/1096* (2013.01); *G11C 7/20* (2013.01); *G11C 11/005* (2013.01); *G11C 11/417* (2013.01); *H03K 19/00* (2013.01)

(58) Field of Classification Search
CPC ..... G11C 14/0054; G11C 7/1096; G11C 7/20; G11C 11/005; G11C 11/417; H03K 19/00
See application file for complete search history.

(56) References Cited

U.S. PATENT DOCUMENTS

| | | | | |
|---|---|---|---|---|
| 2007/0150641 A1* | 6/2007 | Honda | ................ | G06F 9/30043 711/5 |
| 2010/0146332 A1* | 6/2010 | Arai | .......................... | G06F 8/66 714/6.12 |
| 2014/0173718 A1* | 6/2014 | Kodama | ................ | G06F 21/44 726/19 |

FOREIGN PATENT DOCUMENTS

| | | |
|---|---|---|
| JP | S61-240310 A | 10/1986 |
| JP | H10-333783 A | 12/1998 |
| JP | 2003-323392 A | 11/2003 |
| JP | 3531225 B2 | 5/2004 |

* cited by examiner

*Primary Examiner* — Toan K Le

(74) *Attorney, Agent, or Firm* — White & Case LLP

(57) ABSTRACT

According to one embodiment, a semiconductor integrated circuit includes a ROM, an SRAM, a memory and a selector. The ROM stores initialization data. At least part of the initialization data is writable to the SRAM. The memory stores information indicating whether data is written to the SRAM. The selector outputs one of data supplied from the SRAM and data supplied from the ROM in accordance with the information stored in the memory.

13 Claims, 8 Drawing Sheets

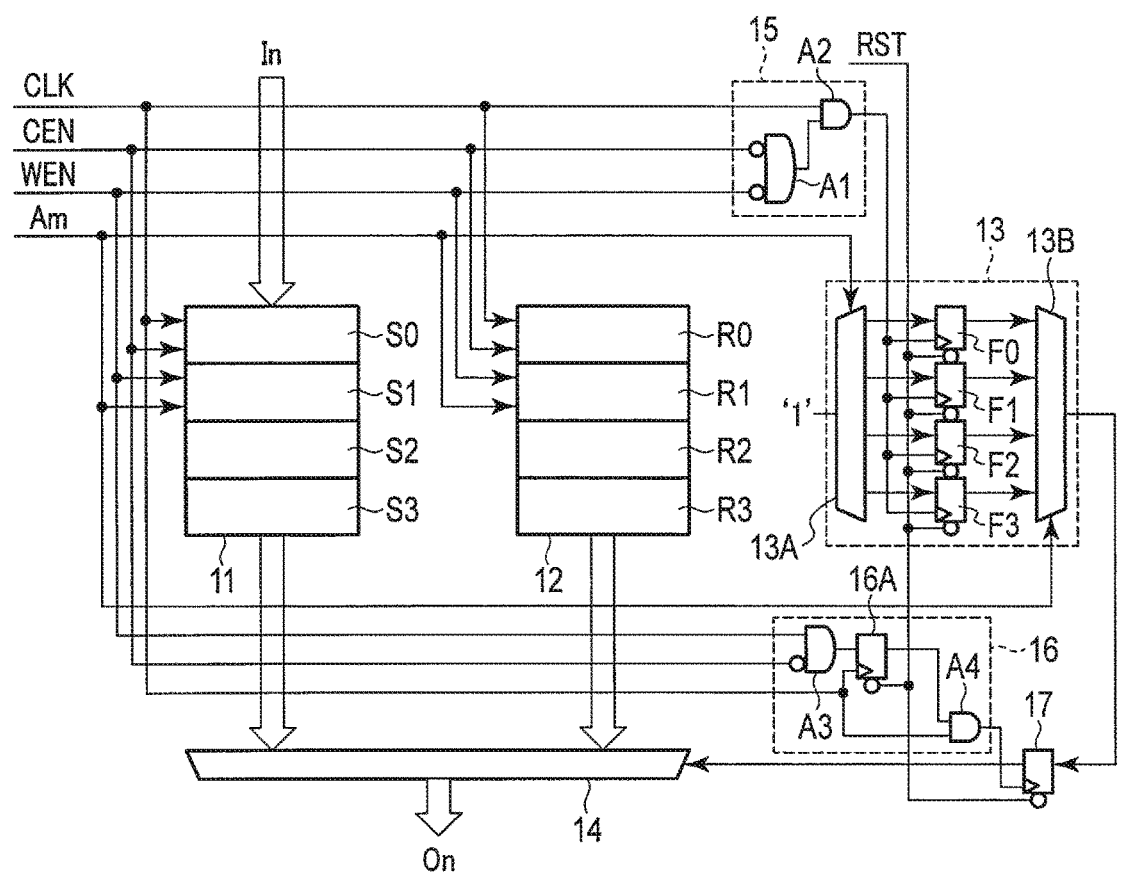
F I G. 6

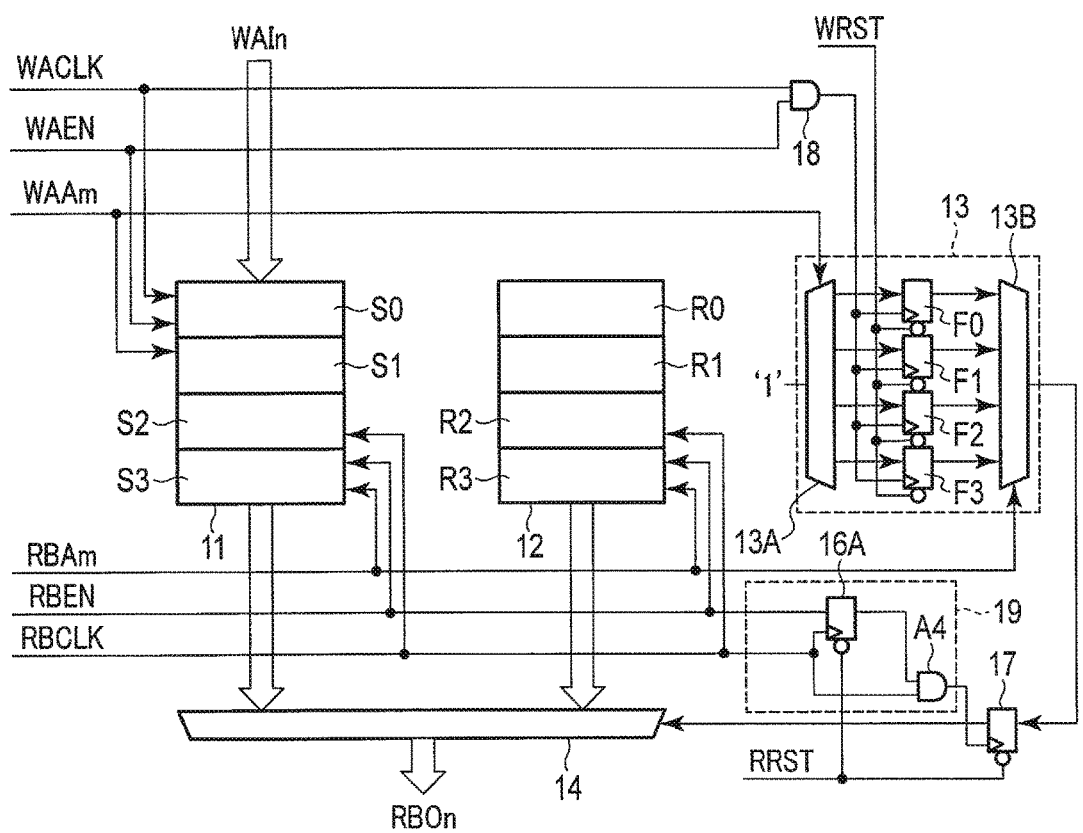
F I G. 8

SEMICONDUCTOR INTEGRATED CIRCUIT

CROSS-REFERENCE TO RELATED APPLICATION

This application is based upon and claims the benefit of priority from Japanese Patent Application No. 2017-056033, filed Mar. 22, 2017, the entire contents of which are incorporated herein by reference.

FIELD

Embodiments described herein relate generally to a semiconductor integrated circuit including an SRAM.

BACKGROUND

Field programmable gate arrays (FPGA) and application specific integrated circuits (ASIC) may use a static random access memory (SRAM) that stores initialization data (initial value). The initialization data is stored in the SRAM by writing the initialization data to the SRAM when the SRAM is initialized to start the circuit. It takes time to write the initialization data to the SRAM at the time of the initialization. The larger the storage capacity of the SRAM for storing the initialization data, the longer the time to write the initialization data to the SRAM.

BRIEF DESCRIPTION OF THE DRAWINGS

FIG. 6 is a diagram showing a first exemplary configuration of the semiconductor integrated circuit according to the first embodiment.

FIG. 8 is a diagram showing a second exemplary configuration of the semiconductor integrated circuit according to the first embodiment.

DETAILED DESCRIPTION

In general, according to one embodiment, a semiconductor integrated circuit includes a ROM, an SRAM, a memory and a selector. The ROM stores initialization data. At least part of the initialization data is writable to the SRAM. The memory stores information indicating whether data is written to the SRAM. The selector outputs one of data supplied from the SRAM and data supplied from the ROM in accordance with the information stored in the memory.

Embodiments will be described below with reference to the accompanying drawings. In the following description, the same symbol will be used to denote structural elements having substantially the same function and configuration. Each of the embodiments exemplifies a device and a method for embodying the technical concept of the embodiment and does not limit the material, shape, configuration, placement, etc. of the structural elements to the following matters.

The function blocks each can be achieved as one of hardware and computer software or a combination thereof. It is not essential that the function blocks be distinguished as exemplified below. For example, a function can be performed by a function block other than the exemplary function blocks. The exemplary function blocks each can be divided into function subblocks.

[1] First Embodiment

A semiconductor integrated circuit according to a first embodiment will be described.

[1-1] Configuration of Semiconductor Integrated Circuit

Figure 1:
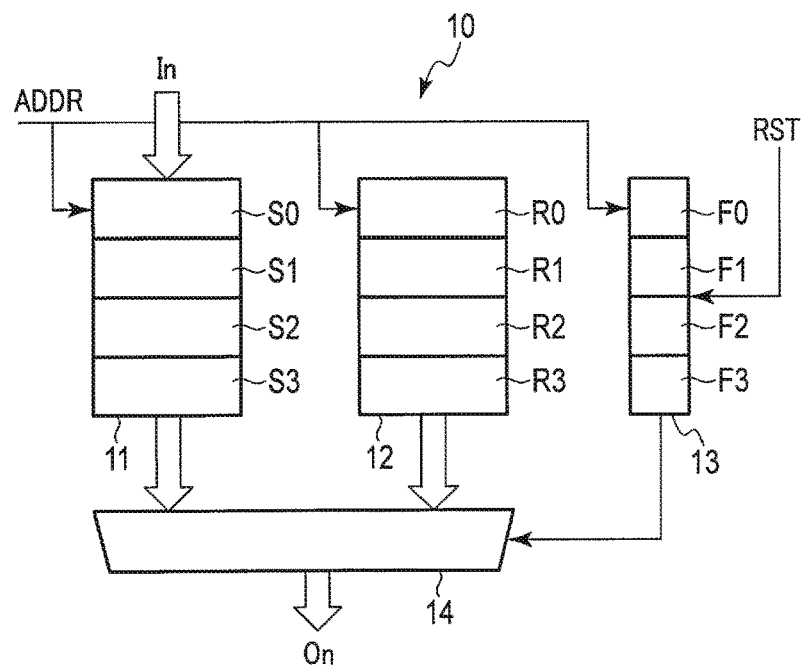
FIG. 1 is a diagram showing a configuration of a semiconductor integrated circuit according to a first embodiment.

FIG. 1 is a diagram showing a configuration of a semiconductor integrated circuit 10 according to a first embodiment. As shown in FIG. 1, the semiconductor integrated circuit 10 includes a static random access memory (SRAM) 11, a read-only memory (ROM) 12, a flag storage section 13 and a data selector 14.

The SRAM 11 is a volatile memory capable of storing a large amount of data. Note that the SRAM 11 includes storage areas (e.g. words) S0, S1, S2 and S3 as an access unit for writing and reading. If an address ADDR is input, it designates one of the storage areas S0 to S3 as a target for writing or reading. In other words, data In is written to a storage area designated by the address ADDR, and data is read out of a storage area designated by the address ADDR and input to the data selector 14.

The ROM 12 has the same memory capacity as that of, e.g. the SRAM 11, and includes storage areas R0, R1, R2 and R3 of the same access unit as that of the SRAM 11. The storage areas R0, R1, R2 and R3 of the ROM 12 respectively correspond to the storage areas S0, S1, S2 and S3 of the SRAM 11. In other words, the same address ADDR designates one of the storage areas S0 to S3 and its corresponding one of the storage areas R0 to R3. The storage areas R0 to R3 of the ROM 12 store data to be set as an initial state in the SRAM 11, namely initialization data (also referred to as an initial value) to be stored in the SRAM 11 for initialization. To read data, for example, an address ADDR is input to designate one of the storage areas R0 to R3 as a target for reading. Data is read out of the designated storage area and input to the data selector 14.

The flag storage section 13 includes flag registers F0, F1, F2 and F3 the number of which is the same as that of the storage areas of the SRAM 11 and the ROM 12. The flag registers F0, F1, F2 and F3 respectively correspond to the storage areas S0, S1, S2 and S3 of the SRAM 11.

The flag registers F0, F1, F2 and F3 store flags corresponding to the write states of the storage areas S0, S1, S2 and S3, respectively. When a reset signal RST is input, the flags stored in the flag registers F0 to F3 are reset. For example, the flags of the flag registers F0 to F3 are set to "0." To write data, the flag of a flag register designated by the address ADDR is reversed. For example, the flags of the flag registers F0 to F3 are set to "1" from "0." To read data, the flag of a flag register designated by the address ADDR is selected and supplied to the data selector 14.

The data selector 14 receives a flag from the flag storage section 13. When the flag is "0," the data selector 14 selects data read from the ROM 12 and outputs it. When the flag is "1," the data selector 14 selects data read from the SRAM 11 and outputs it.

[1-2] Operation of Semiconductor Integrated Circuit

An operation of the semiconductor integrated circuit according to the first embodiment will be described below.

[1-2-1] Initial Operation

Figure 2:
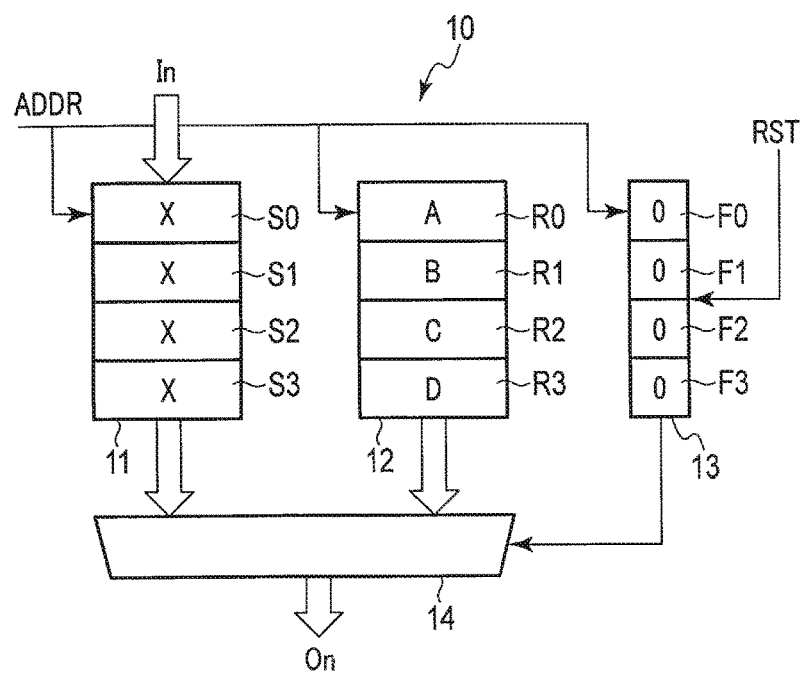
FIG. 2 is a diagram showing an initial operation of the semiconductor integrated circuit according to the first embodiment.

FIG. 2 is a diagram showing an initial operation of the semiconductor integrated circuit 10 according to the first embodiment. When the semiconductor integrated circuit 10 is started, a reset signal RST is asserted. The reset signal RST is input to the flag storage section 13. In response to the reset signal RST, the flags stored in the flag registers F0 to F3 in the flag storage section 13 are reset to, e.g. "0."

Data stored in the storage areas S0 to S3 of the SRAM 11 is represented by X because the data is indefinite. The storage areas R0, R1, R2 and R3 of the ROM 12 store data A, B, C and D, respectively, as initialization data to be stored in the SRAM 11.

[1-2-2] Write Operation

Figure 3:
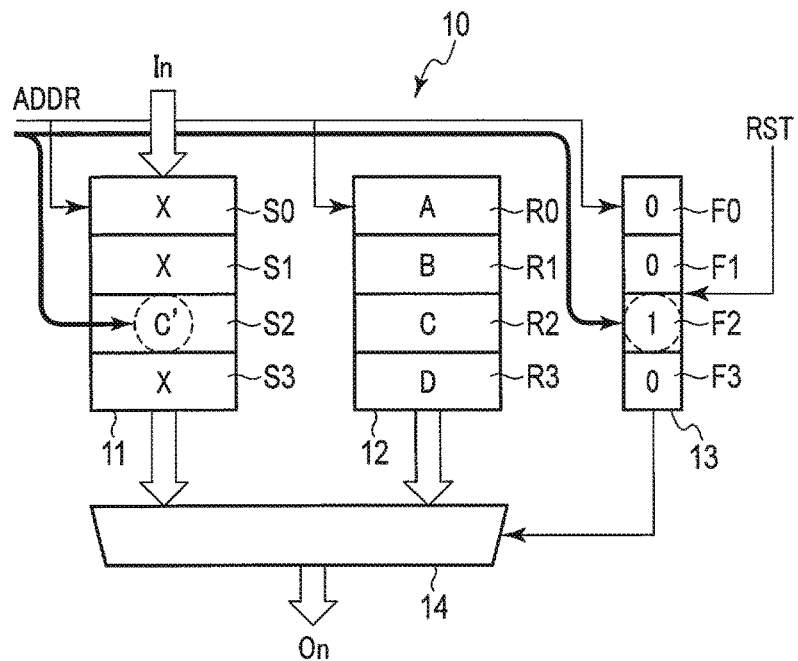
FIG. 3 is a diagram showing a write operation of the semiconductor integrated circuit according to the first embodiment.

FIG. 3 is a diagram showing a write operation of the semiconductor integrated circuit 10. In the write operation of the SRAM 11, like in a normal write operation for the SRAM 11, data In is written to a storage area designated by an address ADDR.

When the data In is written, the flag of a flag register in the storage section 13 corresponding to the storage area to which the data is written, is reversed. In other words, the flag stored in a flag register designated by the address ADDR is reversed.

More specifically, data C' is written to a storage area S2 of the SRAM 11, which is designated by the address ADDR as shown in FIG. 3. When data C' is written to the storage area S2, the flag of the flag register F2 corresponding to the storage area S2 is reversed. In other words, the flag of the flag register F2 designated by the address ADDR is set to "1." The reversal of the flag of the flag register F2 indicates that data has been written to the storage area S2.

[1-2-3] Read Operation

Figure 4:
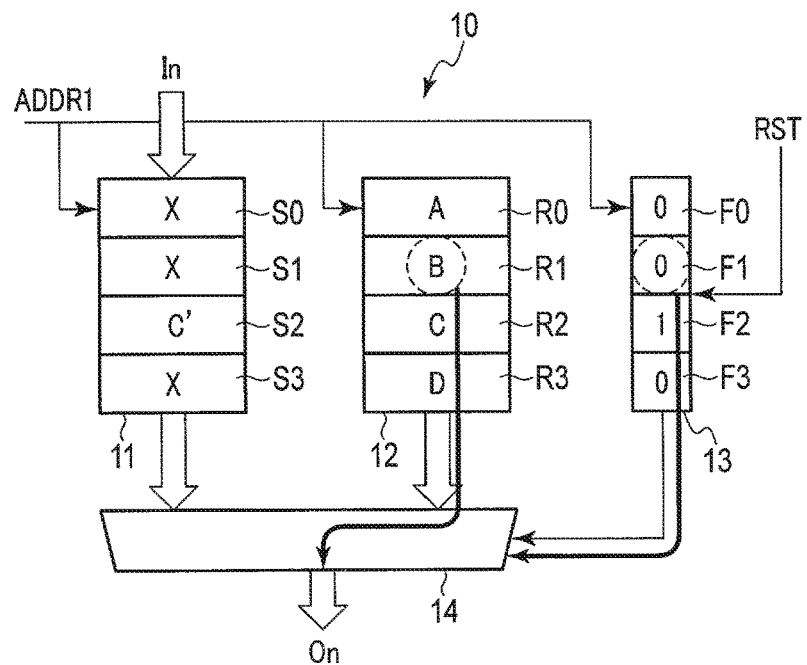
FIG. 4 is a diagram showing a read operation of the semiconductor integrated circuit according to the first embodiment.
Figure 5:
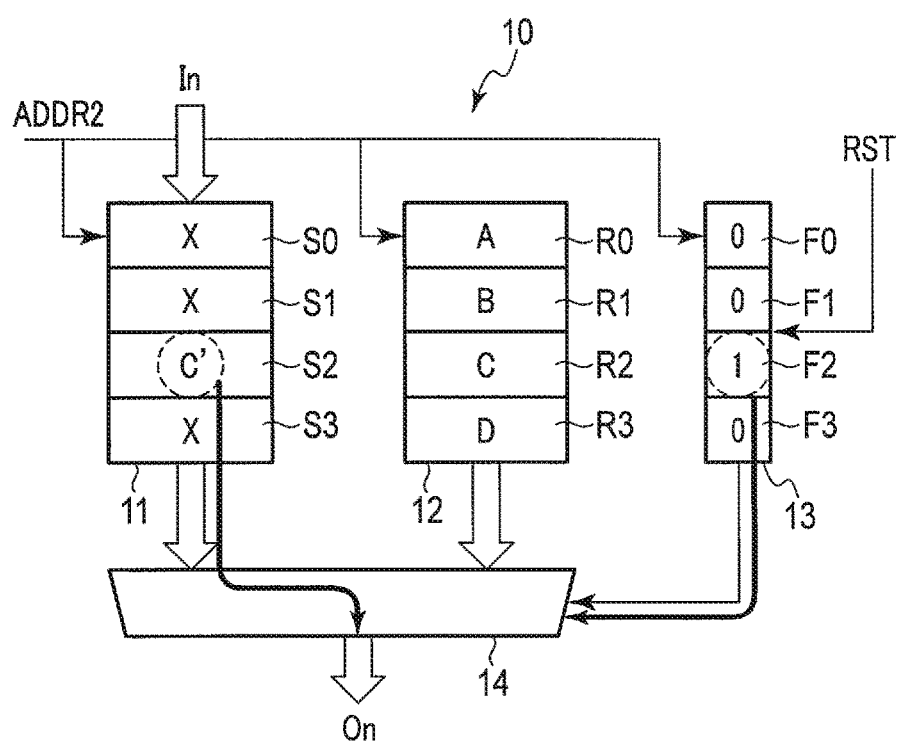
FIG. 5 is a diagram showing a read operation of the semiconductor integrated circuit according to the first embodiment.

FIGS. 4 and 5 are diagrams each showing a read operation of the semiconductor integrated circuit 10. In read operation, data is read out of each of the storage areas of the SRAM 11 and ROM 12 designated by an address ADDR and input to the data selector 14. Along with this, the flag registered in a flag register designated by the address ADDR is input to the data selector 14.

If the flag received by the data selector 14 is "0," the data selector 14 selects data read from the ROM 12 and outputs it because no data is written to the SRAM 11. If the flag received by the data selector 14 is "1," the data selector 14 selects data read from the SRAM 11 and outputs it because data is written to the SRAM 11 and updated.

An operation of reading data from a storage area of the SRAM 11 to which no data is written will be described specifically with reference to FIG. 4. For example, data is read from the storage area S1 of the SRAM 11. Since the storage area S1 is a storage area to which no data is written, it remains indefinite (X).

First, data is read out of each of the storage area S1 of the SRAM 11 and the storage area R1 of the ROM 12, which are designated by an address ADDR1, and input to its corresponding one of the first and second input terminals of the data selector 14. Then, a flag is read out of the flag register F1 designated by the address ADDR1 and input to the control terminal of the data selector 14.

When the flag of the flag register F1 is "0," the data selector 14 selects data B, which is read out of the storage area R1 of the ROM 12, and outputs it.

An operation of reading data from a storage area of the SRAM 11 to which data is written will be described specifically with reference to FIG. 5. For example, data is read from the storage area S2 of the SRAM 11. Since the storage area S2 is a storage area to which data is written, data C' is stored therein.

First, data is read out of each of the storage area S2 of the SRAM 11 and the storage area R2 of the ROM 12, which are designated by an address ADDR2, and input to its corresponding one of the first and second input terminals of the data selector 14. Then, a flag is read out of the flag register F2 designated by the address ADDR2 and input to the control terminal of the data selector 14.

When the flag of the flag register F2 is "1," the data selector 14 selects data C', which is read out of the storage area S2 of the SRAM 11, and outputs it.

[1-3] First Exemplary Configuration and Operation of Semiconductor Integrated Circuit A first exemplary configuration of the semiconductor integrated circuit according to the first embodiment will be described specifically.

[1-3-1] Circuit of First Exemplary Configuration

FIG. 6 is a diagram showing a first exemplary configuration of the semiconductor integrated circuit according to the first embodiment. In the first exemplary configuration, the write and read operations are controlled by a pair of input/output ports. A control signal is common to the write and read operations.

The semiconductor integrated circuit 10 includes an SRAM 11, a ROM 12, a flag storage section 13, a data selector 14, a flag write circuit 15, a flag read circuit 16 and a latency register 17.

The SRAM 11, ROM 12 and data selector 14 each have the same configuration as that shown in FIG. 1. For example, the SRAM 11 includes four storage areas S0, S1, S2 and S3 and an address is assigned to each of the storage areas S0 to S3. The ROM 12 includes storage areas R0, R1, R2 and R3 which respectively correspond to the storage areas S0, S1, S2 and S3 of the SRAM 11. The flag storage section 13 includes flag registers F0, F1, F2 and F3 which respectively correspond to the storage areas S0, S1, S2 and S3 of the SRAM 11. The same address is assigned to the storage areas S0 and R0 and the flag register F0, or the storage areas S1 and R1 and the flag register F1, or the storage areas S2 and R2 and the flag register F2, or the storage areas S3 and R3 and the flag register F3.

The flag storage section 13 includes flag registers F0 to F3, an address decoder 13A and a flag selector 13B. The flag registers F0, F1, F2 and F3 each include a flip flop.

The address decoder 13A selects a flag register to reverse a flag from among the flag registers F0 to F3. The address decoder 13A is supplied with a signal "1." Upon receiving an address signal Am, the address decoder 13A selects from among the flag registers F0 to F3 a flag register to output the signal "1" in response to the address signal Am, and supplies the signal "1" to the selected flag register.

The flag selector 13B selects one of the flags output from the flag registers F0 to F3. Upon receiving an address signal Am, the flag selector 13B selects one of the outputs (flags) from the flag registers F0 to F3 in response to the address signal Am, and supplies the selected output (flag) to the latency register 17.

The flag write circuit 15 controls timing with which data is written to the flag registers F0 to F3. The flag write circuit 15 includes AND circuits (conjunction circuits) A1 and A2.

The flag read circuit 16 controls timing with which data is read out of the flag registers F0 to F3. The flag read circuit 16 includes AND circuits A3 and A4 and a register 16A. The register 16A includes a flip flop.

The latency register 17 adjusts timing with which a flag is output from the flag selector 13B in response to the output of the flag read circuit 16. The flag output from the latency register 17 is supplied to a control terminal of the data selector 2. The latency register 17 includes a flip flop.

The circuit connection of the first exemplary configuration will be described below.

A chip enable signal CEN is input to the SRAM 11, ROM 12, flag write circuit 15 and flag read circuit 16. A write enable signal WEN is input to the SRAM 11, ROM 12, flag write circuit 15 and flag read circuit 16. An address signal Am is input to the SRAM 11, ROM 12, address decoder 13A and flag selector 13B. A clock signal CLK is input to the SRAM 11, ROM 12, flag write circuit 15 and flag read circuit 16.

The inversion signal of the chip enable signal CEN and that of the write enable signal WEN are respectively input to the first input terminal and the second input terminal of the AND circuit A1. The AND circuit A1 outputs a signal and supplies it to the first input terminal of the AND circuit A2. A clock signal CLK is input to the second input terminal of the AND circuit A2.

The AND circuit A2 outputs a signal and supplies it to the control terminal of each of the flag registers F0 to F3. The address decoder 13A outputs a signal and supplies it to the input terminal of each of the flag registers F0 to F3. A reset signal. RST is input to the reset terminal of each of the flag registers F0 to F3. The flag registers F0 to F3 each output a signal and supplies it to the input terminal of the flag selector 13B. The flag selector 13B outputs a signal and supplies it to the input terminal of the latency register 17.

The inversion signal of the chip enable signal CEN is input to the first input terminal of the AND circuit A3. The write enable signal WEN is input to the second input terminal of the AND circuit A3. The AND circuit A3 outputs a signal and supplies it to the input terminal of the register 16A. The clock signal CLK is input to the control terminal of the register 16A and the first input terminal of the AND circuit A4. The reset signal RST is input to the reset terminal of the register 16A. The register 16A outputs a signal and supplies it to the second input terminal of the AND circuit A4.

The AND circuit A4 outputs a signal and supplies it to the control terminal of the latency register 17. The reset signal RST is input to the reset terminal of the latency register 17. The latency register 17 outputs a signal and supplies it to the control terminal of the data selector 14.

[1-3-2] Operation of First Exemplary Configuration

Figure 7:
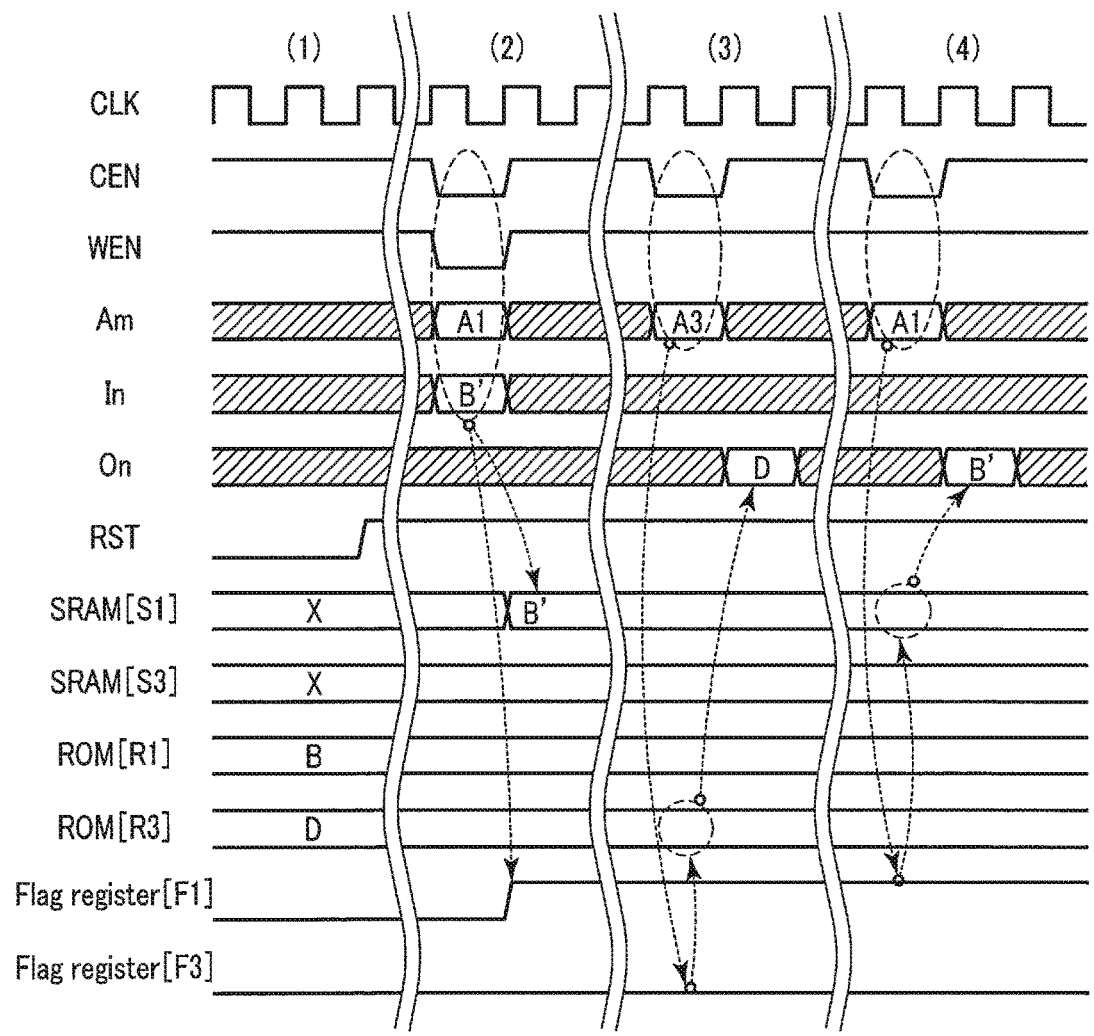
FIG. 7 is a timing chart showing an operation of the first exemplary configuration of the semiconductor integrated circuit according to the first embodiment.

FIG. 7 is a timing chart showing an operation of the first exemplary configuration of the semiconductor integrated circuit 10.

The period (1) shown in FIG. 7 represents a reset state of the SRAM 11, ROM 12 and flag storage section 13. When "0" is input as a reset signal RST, the SRAM 11, ROM 12 and flag storage section 13 are rendered in the reset state, and the flag registers F0 to F3 are reset to "0." In contrast, the data stored in the storage areas S0 to 93 of the SRAM 11 is indefinite (represented by X in FIG. 7) because the SRAM 11 is not influenced by the reset signal RST. The storage areas R0 to R3 of the ROM 12 store initialization data (initial value) to be stored in the SRAM 11.

When "1" is input as a reset signal RST, the reset state is released and the subsequent normal operation (write operation and read operation) is performed.

The period (2) shown in FIG. 7 represents an operation of writing data to the SRAM 11. An operation of writing data B' to the storage area S1 of the SRAM 11 will be described below.

First, when "0" is input as a chip enable signal CEN and "0" is input as a write enable signal WEN, a write operation is started. A1 (address that designates the storage area S1) is input as an address signal Am, and B' is input as input data In. Accordingly, data B' is written to the storage area S1 of the SRAM 11.

When data B' is written to the storage area S1 of the SRAM 11, "1" is written to the flag register F1 corresponding to the storage area S1.

The period (3) shown in FIG. 7 represents an operation of reading data from an address A3 to which no data is written. In this operation, the storage area S3 of the SRAM 11 and the storage area R3 of the ROM 12 are designated by the address A3, and data is read out of the storage areas S3 and R3, and the data read out of the storage area R3 is output.

First, when "0" is input as a chip enable signal CEN and "1" is input as a write enable signal WEN, a read operation is started. A3 is input as an address signal Am. Accordingly, data is read out of the storage areas S3 and R3 designated by the address A3 and supplied to the data selector 14.

In the above case, the flag of the flag register F3 corresponding to the storage area S3 is "0," which indicates that no data is written to the storage area S3 of the SRAM 11, or no data is written to the storage area S3 after the reset state. Therefore, upon receiving "0" from the flag selector 13B through the latency register 17, the data selector 14 selects data D that is set in the storage area R3 of the ROM 12 as an initial value, and outputs it as data On.

The period (4) shown in FIG. 7 represents an operation of reading data out of an address A1 to which data has been written. In this operation, the storage area S1 of the SRAM 11 and the storage area R1 of the ROM 12 are designated by the address A1, and data is read out of the storage areas S1 and R1, and the data read out of the storage area S1 is output. The storage area S1 is an area in which a write operation has been performed, as described above regarding the period (2).

Like in the period (3), when "0" is input as a chip enable signal CEN and "1" is input as a write enable signal WEN, a read operation is started. A1 is input as an address signal Am. Accordingly, data is read out of the storage areas S1 and R1 designated by the address A1 and supplied to the data selector 14.

In the above case, the flag of the flag register F1 is "1," which indicates that data has been written to the storage area S1 of the SRAM 11, or data is written to the storage area S1 after the reset state. Therefore, upon receiving "1" from the flag selector 13B through the latency register 17, the data selector 14 selects data B' that is written to the storage area S1 of the SRAM 11, and outputs it as data On.

[1-4] Second Exemplary Configuration and Operation of Semiconductor Integrated Circuit A second exemplary configuration of the semiconductor integrated circuit according to the first embodiment will be described in detail.

[1-4-1] Circuit of Second Exemplary Configuration

FIG. 8 is a diagram showing a second exemplary configuration of the semiconductor integrated circuit according to the first embodiment. In the second exemplary configuration, the write operation is controlled by a pair of input/output ports and the read operation is controlled by another pair of input/output ports. A control signal is different in the write and read operations.

The semiconductor integrated circuit 10 includes an SRAM 11, a ROM 12, a flag storage section 13, a data selector 14, a flag write circuit 18, a flag read circuit 19 and a latency register 17. The SRAM 11, ROM 12, flag storage section 13, data selector 14 and latency register 17 each have the same configuration as that shown in FIGS. 1 and 6.

The flag write circuit 18 controls timing with which data is written to the flag registers F0 to F3. The flag write circuit 18 includes an AND circuit.

The flag read circuit 19 controls timing with which data is read out of the flag registers F0 to F3. The flag read circuit 19 includes a register 16A and an AND circuit A4.

The circuit connection of the second exemplary configuration will be described below.

A write enable signal WAEN is input to the SRAM 11 and the flag write circuit 18. A write address signal WAAm is input to the SRAM 11 and the address decoder 13A. A write clock signal WACLK is input to the SRAM 11 and the flag write circuit 18.

The flag write circuit 18 outputs a signal and inputs it to each of the control terminals of the flag registers F0 to F3. The address decoder 13A outputs a signal and inputs it to each of the input terminals of the flag registers F0 to F3. A reset signal WRST is input to each of the reset terminals of the flag registers F0 to F3. The flag registers F0 to F3 each output a signal and input it to the input terminal of the flag selector 13B. The flag selector 13B outputs a signal and inputs it to the input terminal of the latency register 17.

A read enable signal RBEN is input to the input terminals of the SRAM 11, ROM 12 and register 16A. A read address signal RBAm is input to the SRAM 11, ROM 12 and flag selector 13B. A read clock signal RBCLK is input to the control terminals of the SRAM 11, ROM 12 and register 16A and the first input terminal of the AND circuit A4. A read reset signal RRST is input to the reset terminal of the register 16A. The register 16A outputs a signal and inputs it to the second input terminal of the AND circuit A4.

The AND circuit A4 outputs a signal and inputs it to the control terminal of the latency register 17. A read reset signal RRST is input to the reset terminal of the latency register 17. The latency register 17 outputs a signal and inputs it to the control terminal of the data selector 14.

[1-4-2] Operation of Second Exemplary Configuration

Figure 9:
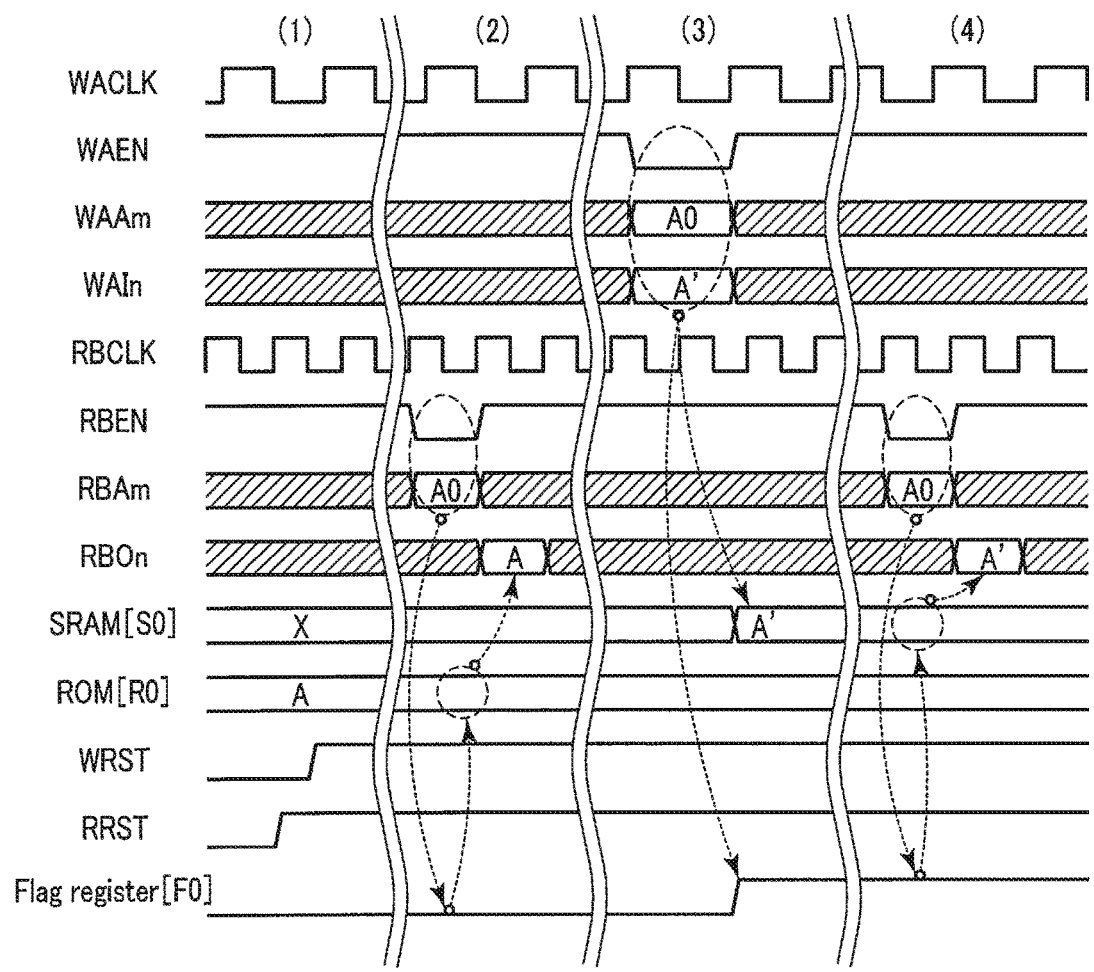
FIG. 9 is timing chart showing an operation of the second exemplary configuration of the semiconductor integrated circuit according to the first embodiment.

FIG. 9 is a timing chart showing an operation of the second exemplary configuration of the semiconductor integrated circuit 10.

The period (1) shown in FIG. 9 represents a reset state of the SRAM 11, ROM 12 and flag storage section 13. When "0" is input as a write reset signal WRST and "0" is input as a read reset signal RRST, the SRAM 11, ROM 12 and flag storage section 13 are rendered in the reset state. When "0" is input as a write reset signal WRST, the flag registers F0 to F3 are reset to "0." In contrast, the data stored in the storage areas S0 to S3 of the SRAM 11 is indefinite (represented by X in FIG. 9) because the SRAM 11 is not influenced by the write reset signal WRST or the read reset signal RRST. The storage areas R0 to R3 of the ROM 12 store initialization data (initial value) to be stored in the SRAM 11.

When "1" is input as a read reset signal RRST and "1" is input as a write reset signal WRST, the reset state is released and the subsequent normal write operation and read operation are performed.

The period (2) shown in FIG. 9 represents an operation of reading data from an address A0 to which no data is written. In this operation, the storage area S0 of the SRAM 11 and the storage area R0 of the ROM 12 are designated by the address A0, and data is read out of the storage areas S0 and R0, and the data read out of the storage area R0 is output.

First, when "0" is input as a read enable signal RBEN, a read operation is started. A0 is input as an address signal RBAm. Accordingly, data is read out of the storage areas S0 and R0 designated by the address A0, and supplied to the data selector 14.

In the above case, the flag of the flag register F0 corresponding to the storage area S0 is "0," which indicates that no data is written to the storage area S0 of the SRAM 11, or no data is written to the storage area S0 after the reset state. Therefore, upon receiving "0" from the flag selector 13B through the latency register 17, the data selector 14 selects data A that is set in the storage area R0 of the ROM 12 as an initial value, and outputs it as data RBOn.

The period (3) shown in FIG. 9 represents an operation of writing data to the SRAM 11. An operation of writing data A' to the storage area S0 of the SRAM 11 will be described below.

First, when "0" is input as a write enable signal WAEN, a write operation is started. A0 (address that designates the storage area S0) is input as an address signal WAAm, and A' is input as input data WAIn. Accordingly, data A' is written to the storage area S0 of the SRAM 11.

When data A' is written to the storage area S0 of the SRAM 11, "1" is written to the flag register F0 corresponding to the storage area S0.

The period (4) shown in FIG. 9 represents an operation of reading data from address A0 to which data has been written. In this operation, the storage area S0 of the SRAM 11 and the storage area R0 of the ROM 12 are designated by the address A0, and data is read from the storage area S0 and R0, and the data read out of the storage area S0 is output. The storage area S0 is an area in which a write operation has been performed, as described above regarding the period (3).

Like in the period (2), when "0" is input as a read enable signal RBEN, a read operation is started. A0 is input as an address signal RBAm. Accordingly, data is read out of the storage areas S0 and R0 designated by the address A0 and supplied to the data selector 14.

In the above case, the flag of the flag register F0 corresponding to the storage area S0 is "1," which indicates that data has been written to the storage area S0 of the SRAM 11, or data is written to the storage area S0 after the reset state. Therefore, upon receiving "1" from the flag selector 13B through the latency register 17, the data selector 14 selects data A' that is written to the storage area S0 of the SRAM 11, and outputs it as data RBOn.

[1-5] Advantages of First Embodiment

The semiconductor integrated circuit according to the first embodiment makes it possible to shorten the time to read initialization data from the SRAM when the circuit is started or initialized.

Advantages of the semiconductor integrated circuit according to the first embodiment will be described in detail below.

In semiconductor integrated circuits such as FPGA and ASIC, when a circuit is started or initialized, initialization data is set in an SRAM of the FPGA and ASIC by writing data to the SRAM. In this case, however, it takes time to write the initialization data to the SRAM. The larger the amount of initialization data, the longer the write time.

In the first embodiment, therefore, update data included in the initialization data stored in the storage areas of the ROM 12, is written to a storage area of the SRAM corresponding to a storage area including update data for update. The flag registers are provided to store whether a write operation has been performed for each storage area of the SRAM such that a storage area of the SRAM to which data is written can be identified.

When no data is written to a first storage area of the SRAM, an initial value stored in advance in a storage area of the ROM 12 corresponding to the first storage area is output. When data is written to a second storage area of the SRAM, update data stored in the second storage area of the SRAM is output. Thus, in the first embodiment, data has only to be written to a storage area of the SRAM 11 corresponding to a storage area of the ROM 12 in which an initial value to be updated is stored, and all initialization data need not be written to the SRAM. It is therefore possible to shorten the time to read initialization data from a circuit including the SRAM 11 and the ROM 12 when the circuit is started or initialized. Consequently, the time to read the initialization data can be made shorter than the time to read initialization data from the SRAM after initialization data is all written to the SRAM.

[2] Second Embodiment

A second embodiment is directed to a case where initialization data to be stored in the SRAM 11 is limited to "0."

[2-1] Configuration and Operation of Semiconductor Integrated Circuit

Figure 10:
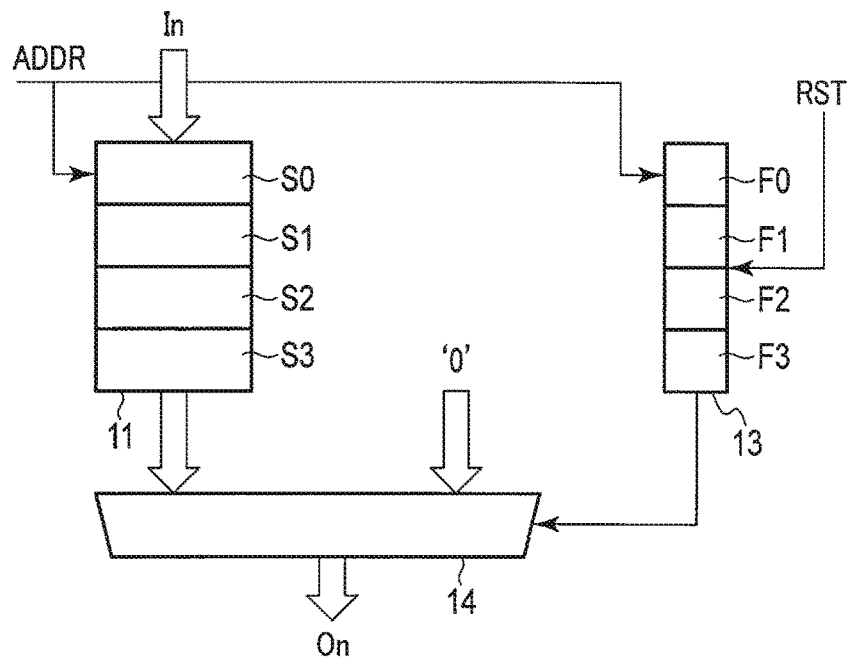
FIG. 10 is a diagram showing a configuration of a semiconductor integrated circuit according to a second embodiment.

FIG. 10 is a diagram showing a configuration of a semiconductor integrated circuit according to the second embodiment. When initialization data to be stored in the SRAM 11 is limited to "0" or when initialization data to be stored in the SRAM 11 is all set to "0," the ROM 12 is excluded from the configuration of the first embodiment shown in FIG. 1, namely the ROM 12 connected to one input terminal of the data selector 14 is excluded and a fixed value "0" is input to the input terminal, as shown in FIG. 10. The other configurations are the same as those of the first embodiment shown in FIG. 1.

The initial operation and the write operation of the second embodiment are the same as those of the first embodiment.

In the read operation, data is read from a storage area of the SRAM 11 designated by an address ADDR and the read data is input to the first input terminal of the data selector 14. A fixed value "0" is input to the second input terminal of the data selector 14. Along with this, a flag registered in the flag register designated by the address ADDR is selected and input to the data selector 14.

If the flag received from the flag register is "0," the data selector 14 selects the fixed value "0" and outputs it because no data is written to the SRAM 11. If the flag received from the flag register is "1," the data selector 14 selects the data read out from the SRAM 11 and outputs it because data is written to the SRAM 11 and updated.

[2-2] Configuration and Operation of Modification to Semiconductor Integrated Circuit When initialization data to be stored in the SRAM 11 is limited to "0," the data selector 14 can be replaced with an AND circuit 21.

Figure 11:
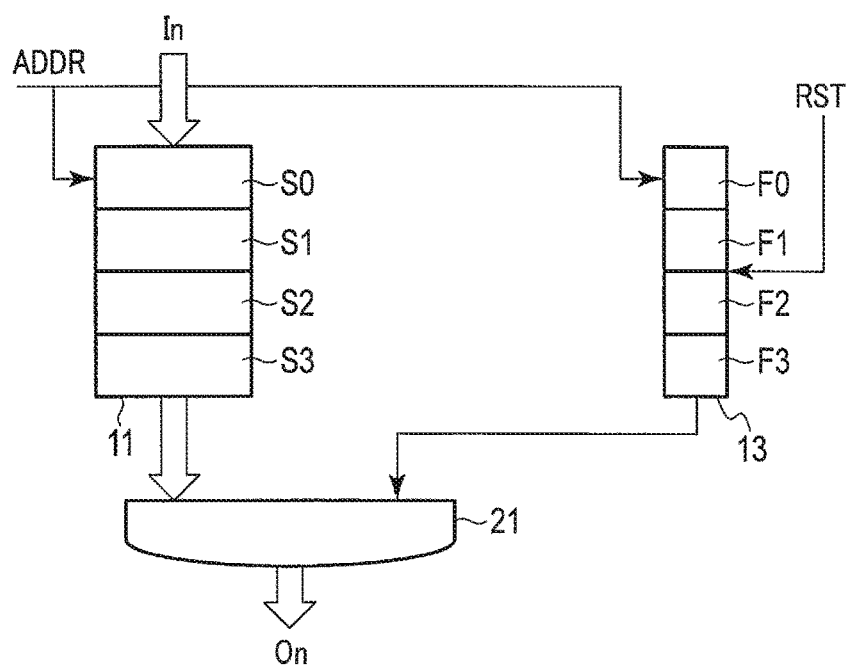
FIG. 11 is a diagram showing a configuration of a semiconductor integrated circuit according to a modification to the second embodiment.

FIG. 11 is a diagram showing a configuration of a semiconductor integrated circuit according to a modification to the second embodiment. In the modification, the ROM 12 is excluded from the configuration of the first embodiment shown in FIG. 1 and the data selector 14 is replaced with the AND circuit 21. The SRAM 11 outputs a signal and supplies it to the first input terminal of the AND circuit 21, and the flag output from the flag storage section 13 is input to the second input terminal of the AND circuit 21.

The initial operation and the write operation of the modification are the same as those of the first embodiment.

In the read operation, when the flag input to the second input terminal of the AND circuit 21 is "0," or when no data is written to the storage areas of the SRAM 11, the AND circuit 21 outputs a flag of "0", regardless of an output from SRAM 11.

When the flag input to the second input terminal of the AND circuit 21 is "1," or when data is written to one of the storage areas of the SRAM 11, the output of the AND circuit 21 corresponds to the output data of the SRAM 11.

[2-4] Advantages of Second Embodiment

The semiconductor integrated circuits according to the second embodiment and modification make it possible to shorten the time to read initialization data from the SRAM when the circuit is started or initialized.

In the second embodiment, since the input terminal to which the output data of the ROM 12 of the data selector 14 is input can be set at a fixed value, the ROM 12 can be excluded. The configuration of the semiconductor integrated circuit can thus be simplified.

In the modification, the input terminal of the AND circuit 21 need not be fixed at "0," the configuration of the modification can be simplified more than that of the second embodiment.

The other advantages are the same as those of the first embodiment.

[3] Modifications and Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The embodiments described above make it possible to provide a semiconductor integrated circuit that makes it possible to shorten the time to read initialization data from the SRAM when the circuit is initialized.

What is claimed is:

1. A semiconductor integrated circuit comprising:
    a ROM which stores initialization data;
    an SRAM to which at least part of the initialization data is writable;
    a memory which stores information indicating whether data is written to the SRAM; and
    a selector which outputs one of data supplied from the SRAM and data supplied from the ROM in accordance with the information stored in the memory, wherein
    the SRAM includes a first storage area in which a write operation and a read operation are performed,
    the ROM includes a second storage area corresponding to the first storage area,
    the memory includes a register which corresponds to the first storage area and stores a first value as the information, and
    the first storage area, the second storage area and the register are designated by a single address.

2. The semiconductor integrated circuit according to claim 1, wherein in the write operation, data is written to the first storage area, and the first value of the register is changed to a second value.

3. The semiconductor integrated circuit according to claim 2, wherein in the read operation, the selector outputs data supplied from the ROM when the first value is stored in the register, and the selector outputs data supplied from the SRAM when the second value is stored in the register.

4. The semiconductor integrated circuit according to claim 1, wherein:
    the SRAM includes a plurality of first storage areas, and the ROM includes a plurality of second storage areas corresponding to the first storage areas;
    the memory includes a plurality of registers corresponding to the first storage areas; and
    the circuit further comprises an address decoder which outputs a first value to one of the registers based on an address to designate one of the first storage areas in the write operation.

5. The semiconductor integrated circuit according to claim 1, wherein:
    the SRAM includes a plurality of first storage areas, and the ROM includes a plurality of second storage areas corresponding to the first storage areas;
    the memory includes a plurality of registers corresponding to the first storage areas; and
    the circuit further comprises a selector which outputs the information stored in one of the registers based on an address to designate one of the first storage areas in the read operation.

6. The semiconductor integrated circuit according to claim 1, wherein the initialization data is data used when an initialization operation is performed.

7. A semiconductor integrated circuit comprising:
    an SRAM to which at least part of initialization data is writable;
    a memory which stores information indicating whether data is written to the SRAM; and
    a selector which outputs one of data supplied from the SRAM and a value in accordance with the information stored in the memory, wherein
    the SRAM includes a first storage area in which a write operation and a read operation are performed,
    the memory includes a register which corresponds to the first storage area and stores a first value as the information, and
    the first storage area and the register are designated by a single address.

8. The semiconductor integrated circuit according to claim 7, wherein in the write operation, data is written to the first storage area, and the first value of the register is changed to a second value.

9. The semiconductor integrated circuit according to claim 7, wherein in the read operation, the selector outputs the value when the information stored in the memory is a first value, and the selector outputs data supplied from the SRAM when the information stored in the memory is a second value.

10. A semiconductor integrated circuit comprising:
    an SRAM to which at least part of initialization data is writable;
    a memory which stores information indicating whether data is written to the SRAM; and
    an AND circuit including a first input terminal of which is supplied with data from the SRAM and a second input terminal of which is supplied with the information from the memory.

11. The semiconductor integrated circuit according to claim 10, wherein:
    the SRAM includes a first storage area in which a write operation and a read operation are performed;
    the memory includes a register which corresponds to the first storage area and stores a first value as the information; and
    the first storage area and the register are designated by a single address.

12. The semiconductor integrated circuit according to claim 11, wherein in the write operation, data is written to the first storage area, and the first value of the register is changed to a second value.

13. The semiconductor integrated circuit according to claim 10, wherein in the read operation, the AND circuit outputs the first value supplied to the second input terminal when the information stored in the memory is a first value, and the AND circuit outputs data supplied from the SRAM when the information stored in the memory is a second value.

* * * * *